US012591729B2

(12) United States Patent
Singh et al.

(10) Patent No.: US 12,591,729 B2
(45) Date of Patent: Mar. 31, 2026

(54) ALIGNMENT OF MACROS BASED ON ANCHOR LOCATIONS

(71) Applicant: Xilinx, Inc., San Jose, CA (US)

(72) Inventors: Veeresh Pratap Singh, Hyderabad (IN); Mohit Sharma, Jaipur (IN); Chatla Surya Phanindra, Serilingampalle (IN); Sandip Maity, Hyderabad (IN); Aman Gayasen, Hyderabad (IN); Srinivasan Dasasathyan, Secunderabad (IN)

(73) Assignee: XILINX, INC., San Jose, CA (US)

( * ) Notice: Subject to any disclaimer, the term of this patent is extended or adjusted under 35 U.S.C. 154(b) by 669 days.

(21) Appl. No.: 18/078,540

(22) Filed: Dec. 9, 2022

(65) Prior Publication Data

US 2024/0193341 A1     Jun. 13, 2024

(51) Int. Cl.
*G06F 30/398* (2020.01)
*G06F 30/392* (2020.01)
*G06F 30/394* (2020.01)

(52) U.S. Cl.
CPC .......... *G06F 30/398* (2020.01); *G06F 30/392* (2020.01); *G06F 30/394* (2020.01)

(58) Field of Classification Search
CPC ..... G06F 30/398; G06F 30/392; G06F 30/394
USPC ........................................ 716/111
See application file for complete search history.

(56) References Cited

U.S. PATENT DOCUMENTS

| | | | | |
|---|---|---|---|---|
| 10,997,346 | B2 * | 5/2021 | Thuries ................. | G06F 30/392 |
| 2004/0006754 | A1 * | 1/2004 | Sonohara ............... | H10D 89/00 |
| | | | | 257/E27.009 |
| 2004/0230929 | A1 * | 11/2004 | Zhou ..................... | G06F 30/327 |
| | | | | 716/108 |
| 2005/0183053 | A1 * | 8/2005 | Ishizuka ................. | G06F 30/39 |
| | | | | 716/122 |
| 2008/0235642 | A1 * | 9/2008 | Tangirala ................ | G06F 30/39 |
| | | | | 716/118 |
| 2009/0070722 | A1 * | 3/2009 | Bickford ............... | G06F 30/398 |
| | | | | 716/122 |
| 2011/0035711 | A1 * | 2/2011 | Gaugler ................ | G06F 30/398 |
| | | | | 716/108 |
| 2011/0035712 | A1 * | 2/2011 | Gaugler ................ | G06F 30/392 |
| | | | | 716/105 |
| 2011/0161901 | A1 * | 6/2011 | Berry .................... | G06F 30/396 |
| | | | | 716/108 |
| 2012/0233577 | A1 * | 9/2012 | Chandra ............... | G06F 30/327 |
| | | | | 716/105 |

(Continued)

*Primary Examiner* — Suchin Parihar

(74) *Attorney, Agent, or Firm* — Patterson + Sheridan, LLP

(57) ABSTRACT

Placement of macros of a circuit design includes mapping the macros to types of sub-circuits of an integrated circuit (IC). The IC includes anchors and instances of each type of the types of sub-circuits. The macros are grouped based on couplings of the macros to the anchors specified in the circuit design. Each group includes one or more macros, and the one or more macros in each group are all coupled to the same set of one or more anchors. A location is selected from alternative locations for each group of macros based on a distance of the location from the same set of anchors. Each location includes one or more instances of one or more types of the types of sub-circuits. The circuit design is placed and routed after selecting the location for each group, and implementation data is generated for making an IC that implements the circuit design.

20 Claims, 6 Drawing Sheets

502 Synthesize and map the circuit design

504 Group macros by the shared anchors

506 Find nearest location for each group of macros

508 For groups of macros found to have the same nearest location, assign the location to the group having the greatest priority, and find alternative locations for the other groups 510 Specify locations and sizes of regions according to selected locations 512 Place and route circuit design, adhering to the specified regions 514 Generate configuration data that for implementing the circuit design on a programmable IC

(56)          References Cited

U.S. PATENT DOCUMENTS

| | | | |
|---|---|---|---|
| 2022/0092248 A1* | 3/2022 | Chuang | G06F 30/392 |
| 2022/0374578 A1* | 11/2022 | Lian | G06F 30/398 |
| 2024/0104285 A1* | 3/2024 | Chuang | G06F 30/373 |

* cited by examiner

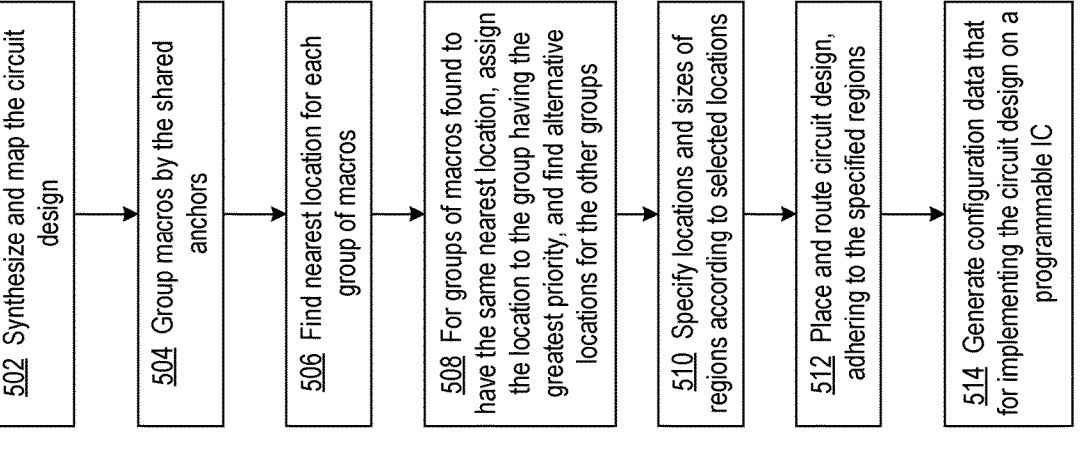

502 Synthesize and map the circuit design

504 Group macros by the shared anchors

506 Find nearest location for each group of macros

508 For groups of macros found to have the same nearest location, assign the location to the group having the greatest priority, and find alternative locations for the other groups 510 Specify locations and sizes of regions according to selected locations 512 Place and route circuit design, adhering to the specified regions 514 Generate configuration data that for implementing the circuit design on a programmable IC

FIG. 5

ALIGNMENT OF MACROS BASED ON ANCHOR LOCATIONS

TECHNICAL FIELD

The disclosure generally relates to placing macros of a circuit design.

BACKGROUND

Some programmable Integrated Circuit (IC) devices have columns of programmable logic, arithmetic circuits, memory circuits, and input/output circuits, etc. The arithmetic circuits in a column can be combined into larger blocks to implement desired functions. Similarly, the memory circuits in a column can be combined to implement memory structures having a desired size and bit-width.

Some design tools provide for the number of arithmetic circuits or memory circuits in a column required by a circuit design to be based on the parameters specified in a "macro." A macro provides a mechanism through which a circuit design can specify parameters to implement Random Access Memory (RAM) in a column of memory circuits or to implement a desired arithmetic function in a column of arithmetic circuits.

A macro can be recognized by a design tool as an element of a circuit design to be placed in performing an implementation flow. That is, based on the parameters of a memory macro, the memory macro can be placed on one or more of the memory circuits in a column. Similarly, based on the parameters of an arithmetic circuit macro, the arithmetic circuit macro can be placed on one or more arithmetic circuits in a column.

In exemplary programmable IC devices from XILINX, Inc., Block RAMs ("BRAMs") and Ultra RAMs ("URAMs") are examples of the aforementioned memory circuits, and Digital Signal Processors ("DSPs") are examples of the aforementioned arithmetic circuits. BRAM, URAM, and DSP macros are typically connected through wide buses (data and address) to fixed logic sub-circuits at fixed locations on the programmable IC device. The fixed logic sub-circuits at fixed locations are referred to as "anchors." Examples of anchors include input/output circuits, serial transceivers, clock management blocks, and arrays of data processing engines, bus interfaces, Ethernet message authentication, processor subsystems, Graphics Processing Units (GPUs), Accelerated Processing Units (APUs), Central Processing Units (CPUs) and other fixed logic circuitry of a programmable IC.

The placement of the macros often results in extensive use of routing resources, which can result in negative slack and create problems in routing other parts of the circuit design. Manual intervention and engineer-directed placement strategies have been customary in attempts to remedy negative slack and routing problems. However, multiple iterations are often required, and improving the slack to an acceptable level remains a challenge.

SUMMARY

A disclosed method includes mapping macros of a circuit design by a design tool to types of sub-circuits of an Integrated Circuit (IC). The IC includes a plurality of anchors and a plurality of instances of each type of the types of sub-circuits. The method includes forming groups of macros by the design tool based on couplings of the macros to the plurality of anchors specified in the circuit design.

Each group includes one or more macros, and these one or more macros in each group are all coupled to a same set of one or more anchors of the plurality of anchors. The method includes selecting a location by the design tool from a plurality of alternative locations for each group of macros based on a distance of the location from the same set of one or more anchors of the plurality of anchors. Each location includes one or more instances of one or more types of the types of sub-circuits of the IC. The method includes placing and routing the circuit design by the design tool after the selecting the location for each group, and generating implementation data by the design tool after the placing and routing for making an IC that implements the circuit design.

A disclosed system includes one or more computer processors configured to execute program code and a memory arrangement coupled to the one or more computer processors. The memory arrangement is configured with instructions of a design tool that when executed by the one or more computer processors cause the one or more computer processors to perform operations including mapping macros of a circuit design to types of sub-circuits of an Integrated Circuit (IC). The IC includes a plurality of anchors and a plurality of instances of each type of the types of sub-circuits. The operations include forming groups of macros based on couplings of the macros to the plurality of anchors specified in the circuit design. Each group includes one or more macros, and the one or more macros in each group are all coupled to a same set of one or more anchors of the plurality of anchors. The operations include selecting a location from a plurality of alternative locations for each group of macros based on a distance of the location from the same set of one or more anchors of the plurality of anchors. Each location includes one or more instances of one or more types of the types of sub-circuits of the IC. The operations include placing and routing the circuit design after selecting the location for each group, and generating implementation data after the placing and routing for making an IC that implements the circuit design.

Other features will be recognized from consideration of the Detailed Description and Claims, which follow.

BRIEF DESCRIPTION OF THE DRAWINGS

Various aspects and features of the methods and systems will become apparent upon review of the following detailed description and upon reference to the drawings in which:

FIG. 5 shows a flowchart of an exemplary process that groups and places macros according to coupled anchors.

DETAILED DESCRIPTION

Figure 1:
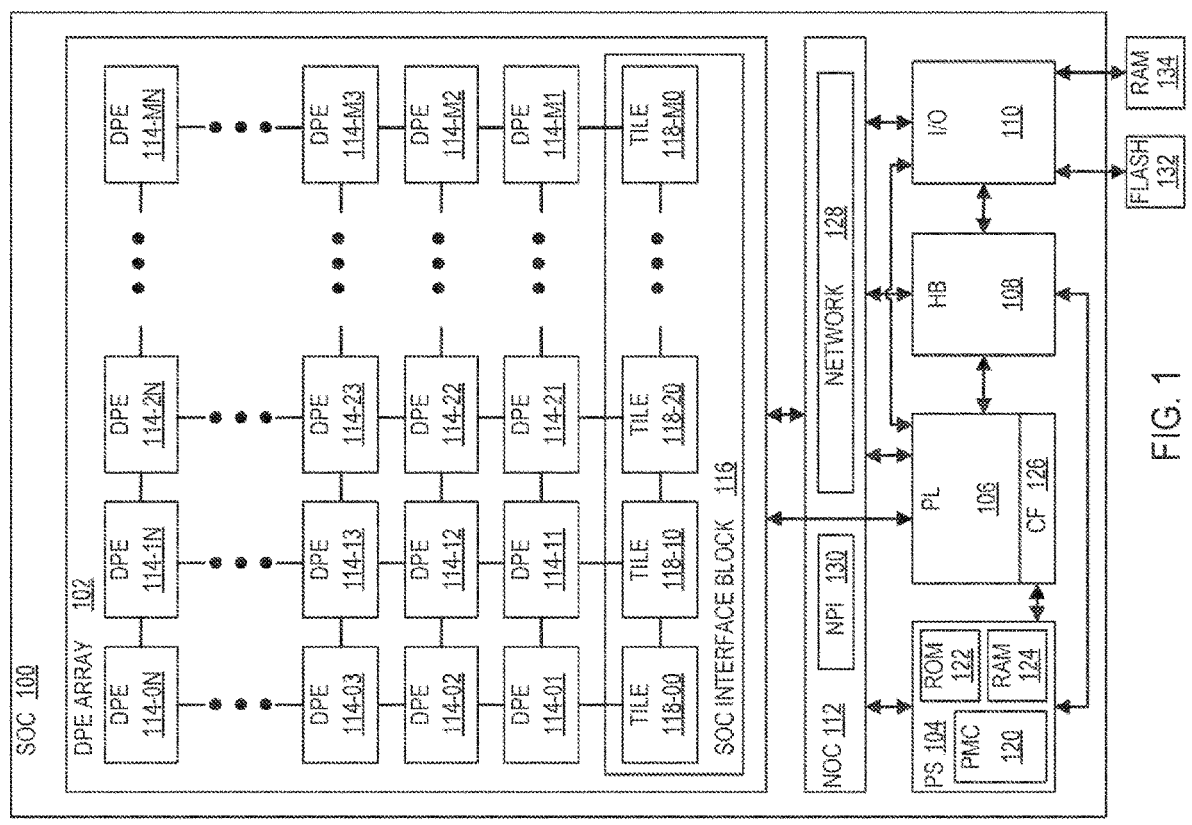
FIG. 1 illustrates an architecture for a programmable integrated circuit (IC) according to some examples.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

The disclosure relates to selecting locations for placing macros based on the location of anchors to which the macros are coupled in a circuit design. Prior approaches for placing macros did not recognize that groups of macros are often coupled to the same anchor or group of anchors. Failing to recognize such groups of macros resulted in placements that consumed excessive routing resources and resulted in negative slack. In some instances, a placement of an initial version of a design could satisfy timing requirements without considering groups of macros coupled to the same anchor(s). However, the implementation flow of a subsequent release may fail to satisfy timing requirements, because the macros may be relocated in a new placement.

Application of the disclosed methods and systems can reduce overall wirelength of a design by placing macros closer to the anchors. By grouping macros according to anchors and choosing to place grouped macros at locations that are near the anchors, the placed macros consume fewer routing resources and can reduce the chances of macro placement will contribute to a failure to satisfy timing requirements.

According to the disclosed methods and systems, a design tool synthesizes a circuit design and maps macros of the circuit design to certain types of sub-circuits of the target programmable IC. Examples of the certain types of sub-circuits include memory circuits and arithmetic circuits, which in XILINX devices are referenced as BRAMs, URAMs, and DSPs. The programmable IC has numerous instances of the certain types of sub-circuits that are disposed at different locations on the IC and on which mapped macros can be alternatively placed.

The macros are grouped by the design tool based on the specified couplings of the macros to anchors of the programmable IC. Each group includes one or more macros, and the macros in each group are all coupled to the same anchor, or to the same set of multiple anchors. The design tool selects a location from multiple alternative locations for placement of each group of macros based on a distance of the location from the same one/set of anchors. Once locations have been selected for placing the groups of macros and locations have been assigned to the groups of macros, the design tool can perform customary place-and-route algorithms to place the macros and the remaining logic of the circuit design.

FIG. 1 illustrates an architecture for a programmable integrated circuit (IC) according to some examples. The programmable device can be a System-on-Chip (SoC) 100. The architecture is generally applicable to programmable devices having higher or lower numbers of resources (e.g., DPEs) as will become apparent. The architecture can be modified with any number of variations, some of which may be identified in the following description.

The SoC 100 includes multiple subsystems, including a DPE array 102, a processing system (PS) 104, programmable logic (PL) 106, hard block circuits (HB) 108, input/output circuits (I/O) 110, and a Network-on-Chip (NoC) 112. In some examples, each sub-system includes at least some component or circuit that is programmable, such as described herein. In some examples, some of the subsystems can include a non-programmable application-specific circuit. Other circuits can be included in the SoC 100, such as other IP blocks like a system monitor or others. The DPE array, PS, HB, and I/O are examples of "anchors" as used herein. "Macros" as used herein can be placed on sub-circuits of the PL.

The DPE array 102 includes a plurality of interconnected DPEs 114-01 through 114-MN (collectively or individually, DPE(s) 114). Each of the DPEs 114 is a hardened circuit block and may be programmable. Each of the DPEs 114 can include the architecture as illustrated in and described below with respect to FIG. 2. In the example of FIG. 1, the DPE array 102 includes a two-dimensional array of DPEs 114 and a SoC interface block 116. The DPE array 102 may be implemented using any of a variety of different architectures. FIG. 1 illustrates DPEs 114 arranged in aligned rows and aligned columns. The DPE array 102 has M+1 columns of DPEs 114 and N rows of DPEs 114. The reference numerals of the DPEs 114 in FIG. 1 indicate the positioning of each DPE 114 by the reference number "114-[column][row]." In some examples, DPEs 114 may be arranged where DPEs 114 in selected rows and/or columns are horizontally inverted or flipped relative to DPEs 114 in adjacent rows and/or columns. In other examples, rows and/or columns of DPEs 114 may be offset relative to adjacent rows and/or columns.

As described in more detail below, the DPEs 114 can communicate various data by different mechanisms within the DPE array 102. The DPEs 114 are connected to form a DPE interconnect network. To form the DPE interconnect network, each DPE 114 is connected to vertically neighboring DPE(s) 114 and horizontally neighboring DPE(s) 114. For example, DPE 114-12 is connected to vertically neighboring DPEs 114 within column 1, which are DPEs 114-11 and 114-13, and is connected to horizontally neighboring DPEs 114 within row 2, which are DPEs 114-02 and 114-22. DPEs 114 at a boundary of the DPE array 102 may be connected to fewer DPEs 114. The DPE interconnect network includes a stream interconnect network and a memory mapped interconnect network. The stream interconnect network includes interconnected stream switches, and application data and direct memory accesses (DMAs) may be communicated between the DPEs 114 via the stream interconnect network. The memory mapped interconnect network includes interconnected memory mapped switches, and configuration data can be communicated between the DPEs 114 via the memory mapped interconnect network. Neighboring DPEs 114 can further communicate via shared memory. An independent cascade stream can be implemented between DPEs 114.

The DPE array 102 further includes the SoC interface block 116 that includes tiles 118-00 through 118-MO (collectively or individually, tile(s) 118). Each of the tiles 118 of the SoC interface block 116 may be hardened and programmable. Each of the tiles 118 can include the architecture as illustrated in and described below with respect to FIG. 3A or 3B. The SoC interface block 116 provides an interface between DPEs 114 of DPE array 102 and other subsystems of the SoC 100, such as the NoC 112 and the PL 106.

In some examples, the SoC interface block 116 is coupled to adjacent DPEs 114. For example, as illustrated in FIG. 1, the SoC interface block 116 may be connected to each DPE 114 in the bottom row of DPEs 114-x1 in the DPE array 102 (where "x" indicates a given column). More particularly, in FIG. 1, each tile 118 of the SoC interface block 116 is connected to a neighboring DPE 114 within the column of the DPE array 102 in which the respective tile 118 is disposed. In FIG. 1, tile 118-00 is connected to DPE 114-01; tile 118-10 is connected to DPE 114-11; tile 118-20 is connected to DPE 114-21; etc. Additionally, each tile 118 is connected to neighboring tiles 118. The SoC interface block 116 is capable of communicating data through the tiles 118, e.g., of propagating data from tile 118-00 to tile 118-10, from tile 118-10 to tile 118-20, etc., and vice versa. A tile 118 within the SoC interface block 116 can communicate with a DPE 114 to which the tile 118 is connected, and the communication can be routed through the DPE interconnect network formed by the interconnected DPEs 114 to a target DPE 114.

Each tile 118 can service a subset of DPEs 114 in the DPE array 102. In the example of FIG. 1, each tile 118 services the column of DPEs 114 above the respective tile 118. The tiles 118 also include stream switches, which are interconnected in the stream interconnect network to stream switches of the DPEs 114, and memory mapped switches, which are interconnected in the memory mapped interconnect network to memory mapped switches of the DPEs 114. Communications from DPEs 114 can be communicated with the tile 118 below the respective DPEs 114 via the interconnected stream switches and/or memory mapped switches. The tile 118 can provide an interface to the PL 106 and/or the NoC 112 for communications therewith.

The PS 104 may be or include any of a variety of different processor types and number of processor cores. For example, the PS 104 may be implemented as an individual processor, e.g., a single core capable of executing program instruction code. In another example, the PS 104 may be implemented as a multi-core processor. The PS 104 may be implemented using any of a variety of different types of architectures. Example architectures that may be used to implement the PS 104 may include an ARM processor architecture, an x86 processor architecture, a graphics processing unit (GPU) architecture, a mobile processor architecture, a digital signal processor (DSP) architecture, or other suitable architecture that is capable of executing computer-readable program instruction code.

The PS 104 includes a platform management controller (PMC) 120, which may be a processor and/or processor core in the PS 104 capable of executing program instruction code. The PS 104 includes read-only memory (ROM) 122 (e.g., programmable ROM (PROM) such as eFuses, or any other ROM) and random access memory (RAM) 124 (e.g., static RAM (SRAM) or any other RAM). The ROM 122 stores program instruction code that the PMC 120 is capable of executing in a boot sequence. The ROM 122 further can store data that is used to configure the tiles 118. The RAM 124 is capable of being written to (e.g., to store program instruction code) by the PMC 120 executing program instruction code from the ROM 122 during the boot sequence, and the PMC 120 is capable of executing program instruction code stored in the RAM 124 during later operations of the boot sequence.

The PL 106 is logic circuitry that may be programmed to perform specified functions. As an example, the PL 106 may be implemented as fabric of an FPGA. The PL 106 can include programmable logic elements including configurable logic blocks (CLBs), look-up tables (LUTs), random access memory blocks (BRAM), Ultra RAMs (URAMs), input/output blocks (IOBs), digital signal processing blocks (DSPs), clock managers, and/or delay lock loops (DLLs). In some architectures, the PL 106 includes columns of programmable logic elements, where each column includes a single type of programmable logic element (e.g., a column of CLBs, a column of BRAMs, etc.).

The programmable logic elements can have one or more associated programmable interconnect elements. For example, in some architectures, the PL 106 includes a column of programmable interconnect elements associated with and neighboring each column of programmable logic elements. In such examples, each programmable interconnect element is connected to an associated programmable logic element in a neighboring column and is connected to neighboring programmable interconnect elements within the same column and the neighboring columns. The interconnected programmable interconnect elements can form a global interconnect network within the PL 106.

The PL 106 has an associated configuration frame interconnect (CF) 126. A configuration frame node residing on the PMC 120 is connected to the CF 126. The PMC 120 sends configuration data to the configuration frame node, and the configuration frame node formats the configuration data in frames and transmits the frames through the CF 126 to the programmable logic elements and programmable interconnect elements. The configuration data may then be loaded into internal configuration memory cells of the programmable logic elements and programmable interconnect elements that define how the programmable elements are configured and operate. Any number of different sections or regions of PL 106 may be implemented in the SoC 100.

The HB 108 can be or include memory controllers (such as double data rate (DDR) memory controllers, high bandwidth memory (HBM) memory controllers, or the like), peripheral component interconnect express (PCle) blocks, Ethernet cores (such as a 100 Gbps (C=100) media address controller (CMAC), a multi-rate MAC (MRMAC), or the like), forward error correction (FEC) blocks, Analog-to-Digital Converters (ADC), Digital-to-Analog Converters (DAC), and/or any other hardened circuit. The I/O 110 can be implemented as eXtreme Performance Input/Output (XPIO), multi-gigabit transceivers (MGTs), or any other input/output blocks. Any of the HB 108 and/or I/O 110 can be programmable.

The NoC 112 includes a programmable network 128 and a NoC peripheral interconnect (NPI) 130. The programmable network 128 communicatively couples subsystems and any other circuits of the SoC 100 together. The programmable network 128 includes NoC packet switches and interconnect lines connecting the NoC packet switches. Each NoC packet switch performs switching of NoC packets in the programmable network 128. The programmable network 128 has interface circuits at the edges of the programmable network 128. The interface circuits include NoC master units (NMUs) and NoC slave units (NSUs). Each NMU is an ingress circuit that connects a master circuit to the programmable network 128, and each NSU is an egress circuit that connects the programmable network 128 to a slave endpoint circuit. NMUs are communicatively coupled to NSUs via the NoC packet switches and interconnect lines of the programmable network 128. The NoC packet switches are connected to each other and to the NMUs and NSUs through the interconnect lines to implement a plurality of physical channels in the programmable network 128. The NoC packet switches, NMUs, and NSUs include register blocks that determine the operation of the respective NoC packet switch, NMU, or NSU.

A physical channel can also have one or more virtual channels. The virtual channels can implement weights to prioritize various communications along any physical channel. The NoC packet switches also support multiple virtual channels per physical channel. The programmable network 128 includes end-to-end Quality-of-Service (QoS) features for controlling data-flows therein. In examples, the programmable network 128 first separates data-flows into designated traffic classes. Data-flows in the same traffic class can either share or have independent virtual or physical transmission paths. The QoS scheme applies multiple levels of priority across traffic classes. Within and across traffic classes, the programmable network 128 applies a weighted arbitration scheme to shape the traffic flows and provide bandwidth and latency that meets the user requirements.

The NPI 130 includes circuitry to write to register blocks that determine the functionality of the NMUs, NSUs, and NoC packet switches. The NPI 130 includes a peripheral interconnect coupled to the register blocks for programming thereof to set functionality. The register blocks in the NMUs, NSUs, and NoC packet switches of the programmable network 128 support interrupts, QoS, error handling and reporting, transaction control, power management, and address mapping control. The NPI 130 includes an NPI root node residing on the PMC 120, interconnected NPI switches connected to the NPI root node, and protocol blocks connected to the interconnected NPI switches and a corresponding register block.

To write to register blocks, a master circuit, such as the PMC 120, sends configuration data to the NPI root node, and the NPI root node packetizes the configuration data into a memory mapped write request in a format implemented by the NPI 130. The NPI transmits the memory mapped write request to interconnected NPI switches, which route the request to a protocol block connected to the register block to which the request is directed. The protocol block can then translate the memory mapped write request into a format implemented by the register block and transmit the translated request to the register block for writing the configuration data to the register block.

The NPI 130 may be used to program any programmable boundary circuit of the SoC 100. For example, the NPI 130 may be used to program any HB 108 and/or I/O 110 that is programmable.

Various subsystems and circuits of the SoC 100 are communicatively coupled by various communication mechanisms. Some subsystems or circuits can be directly connected to others. As illustrated the I/O 110 is directly connected to the HB 108 and PL 106, and the HB 108 is further directly connected to the PL 106 and the PS 104. The PL 106 is directly connected to the DPE array 102. The DPE array 102, PS 104, PL 106, HB 108, and I/O 110 are communicatively coupled together via the programmable network 128 of the NoC 112.

The programmable device illustrated in FIG. 1 can be implemented in a single monolithic integrated circuit (IC) chip, or can be implemented distributed across multiple IC chips. When implemented in multiple IC chips, the IC chips can be stacked on each other, where neighboring chips are bonded (e.g., by hybrid oxide-to-oxide and metal-to-metal bonding) to each other or are attached to each other by external connectors (e.g., minibumps or microbumps). In other examples when implemented in multiple IC chips, the chips can be attached to a common substrate, such as an interposer or a package substrate. In some examples, one chip (e.g., a base chip) can include the PS 104, HB 108, I/O 110, and NoC 112, another one or more chips (e.g., fabric chips) can include the PL 106, and a further one or more chips (e.g., DPE chips) can include the DPE array 102. In a specific example, a chips stack includes a base chip, one or more fabric chips, and a DPE chip, where neighboring chips are bonded together by hybrid bonding, and the one or more fabric chips are disposed in the chip stack between the base chip and the DPE chip.

As will become apparent, DPEs 114 and tiles 118 may be programmed by loading configuration data into configuration registers that define operations of the DPEs 114 and tiles 118, by loading configuration data (e.g., program instruction code) into program memory for execution by the DPEs 114, and/or by loading application data into memory banks of the DPEs 114. The PMC 120 can transmit configuration data and/or application data via the programmable network 128 of the NoC 112 to one or more tiles 118 in the SoC interface block 116 of the DPE array 102. At each tile 118 that receives configuration data and/or application data, the configuration data and/or application data received from the programmable network 128 is converted into a memory mapped packet that is routed via the memory mapped interconnect network to a configuration register, program memory, and/or memory bank addressed by the memory mapped packet (and hence, to a target DPE 114 or tile 118). The configuration data and/or application data is written to the configuration register, program memory, and/or memory bank by the memory mapped packet.

Using a DPE array 102 as described herein in combination with one or more other subsystems provides heterogeneous processing capabilities of the SoC 100. The SoC 100 may have increased processing capabilities while keeping area usage and power consumption low. For example, the DPE array 102 may be used to hardware accelerate particular operations and/or to perform functions offloaded from one or more of the subsystems of the SoC 100. When used with a PS 104, for example, the DPE array 102 may be used as a hardware accelerator. The PS 104 may offload operations to be performed by the DPE array 102 or a portion thereof. In other examples, the DPE array 102 may be used to perform computationally resource intensive operations.

In some examples, the SoC 100 can be communicatively coupled to other components. As illustrated, the SoC 100 is communicatively coupled to flash memory 132 and to RAM 134 (e.g., DDR dynamic RAM (DDRDRAM)). The flash memory 132 and RAM 134 may be separate chips and located, e.g., on a same board (e.g., evaluation board) as the SoC 100. The flash memory 132 and the RAM 134 are communicatively coupled to the I/O 110, which is connected to HB 108 (e.g., one or more memory controllers). The HB 108 is connected to the PS 104 (e.g., the PMC 120). The PMC 120 is capable of reading data from the flash memory 132 via the HB 108 and I/O 110, and writing the read data to local RAM 124 and/or, via the HB 108 and I/O 110, to the RAM 134.

Figure 2:
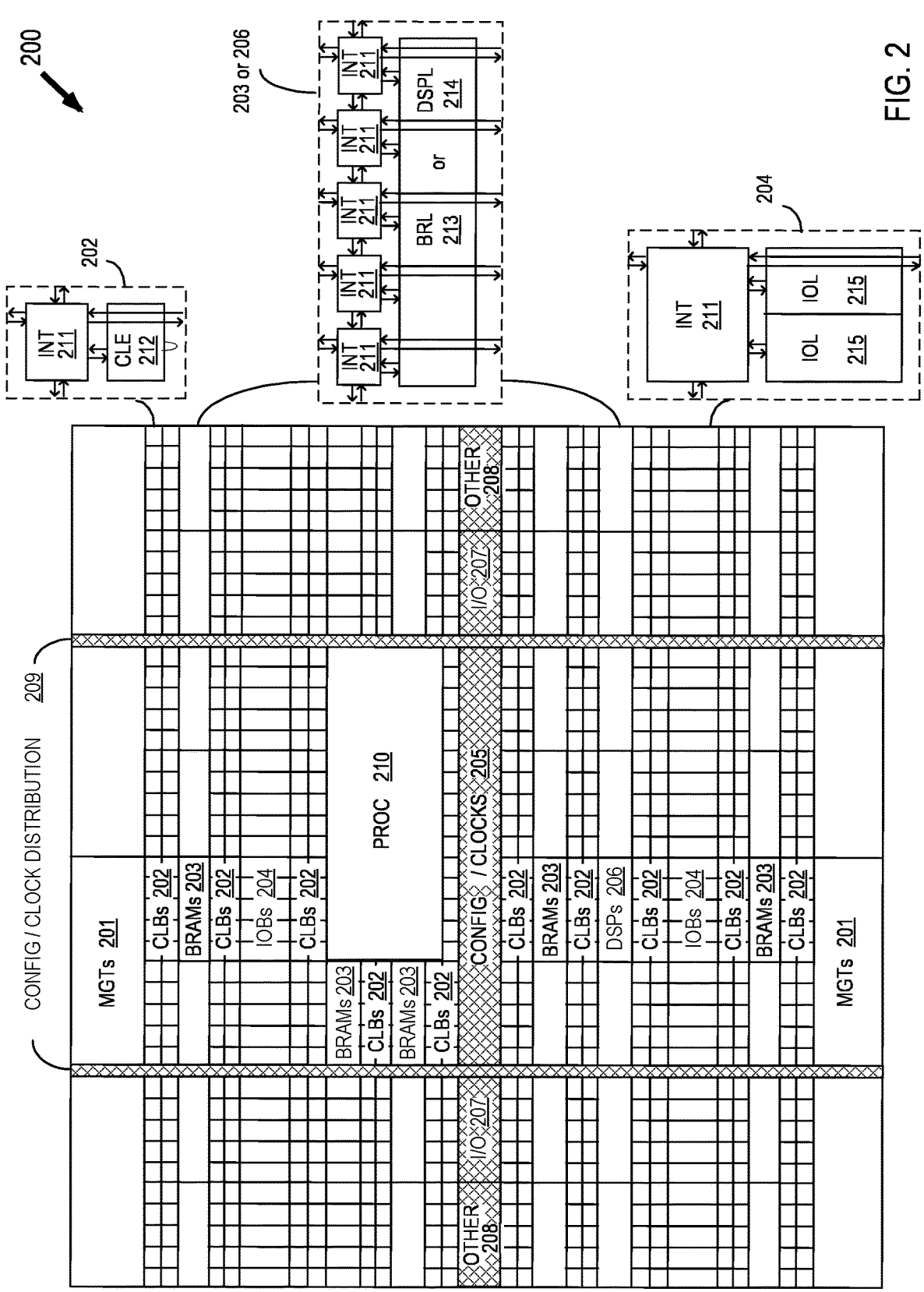
FIG. 2 shows exemplary programmable logic of a programmable IC.

FIG. 2 shows exemplary programmable logic of a programmable IC 200. The programmable IC may also be referred to as a System On Chip (SOC) that includes field programmable gate array logic (FPGA) along with other programmable resources. FPGA logic may include several different types of programmable logic blocks in the array. For example, FIG. 2 illustrates programmable IC 200 that includes a large number of different programmable tiles including multi-gigabit transceivers (MGTs) 201, configurable logic blocks (CLBs) 202, random access memory blocks (BRAMs) 203, input/output blocks (IOBs) 204, configuration and clocking logic (CONFIG/CLOCKS) 205, digital signal processing blocks (DSPs) 206, specialized input/output blocks (I/O) 207, for example, clock ports, and other programmable logic 208 such as digital clock managers, analog-to-digital converters, system monitoring logic, and so forth. The MGTs 201, IOBs 204, and specialized I/O blocks 207 are additional examples of "anchors" as used herein. Some programmable IC having FPGA logic also include dedicated processor blocks (PROC) 210 and internal and external reconfiguration ports (not shown). Circuit designs processed according to the disclosed methods and systems can also be implemented as ASICs or on an adaptive compute acceleration platform (ACAP). An ACAP has FPGA fabric with distributed memory and hardware-programmable DSP blocks, a multicore SoC, and one or more software programmable, yet hardware adaptable, compute engines, all connected through a network on chip (NoC).

In some FPGA logic, each programmable tile includes a programmable interconnect element (INT) 211 having standardized connections to and from a corresponding interconnect element in each adjacent tile. Therefore, the programmable interconnect elements taken together implement the programmable interconnect structure for the illustrated FPGA logic. The programmable interconnect element INT 211 also includes the connections to and from the programmable logic element within the same tile, as shown by the examples included at the top of FIG. 2.

For example, a CLB 202 can include a configurable logic element CLE 212 that can be programmed to implement user logic, plus a single programmable interconnect element INT 211. A BRAM 203 can include a BRAM logic element (BRL) 213 in addition to one or more programmable interconnect elements. Typically, the number of interconnect elements included in a tile depends on the height of the tile. The illustrated BRAM tile has the same height as five CLBs, but other numbers (e.g., four) can also be used. A DSP tile 206 can include a DSP logic element (DSPL) 214 in addition to an appropriate number of programmable interconnect elements. An IOB 204 can include, for example, two instances of an input/output logic element (IOL) 215 in addition to one instance of the programmable interconnect element INT 211. As will be clear to those of skill in the art, the actual I/O bond pads connected, for example, to the I/O logic element 215, are manufactured using metal layered above the various illustrated logic blocks, and typically are not confined to the area of the input/output logic element 215. The columns of BRAMs 203 and DSPs 206 are examples having instances of BRAMs and DSPs at locations that corresponding macros can be placed according to the disclosed methods and systems.

A columnar area near the center of the die (shown shaded in FIG. 2) is used for configuration, clock, and other control logic. Horizontal areas 209 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 2 include additional logic blocks that disrupt the regular columnar structure making up a large part of the programmable IC. The additional logic blocks can be programmable blocks and/or dedicated logic. For example, the processor block PROC 210 shown in FIG. 2 spans several columns of CLBs and BRAMs.

Note that FIG. 2 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 2 are purely exemplary. For example, in an actual programmable IC, more than one adjacent column of CLBs is typically included wherever the CLBs appear, to facilitate the efficient implementation of user logic.

Figure 3:
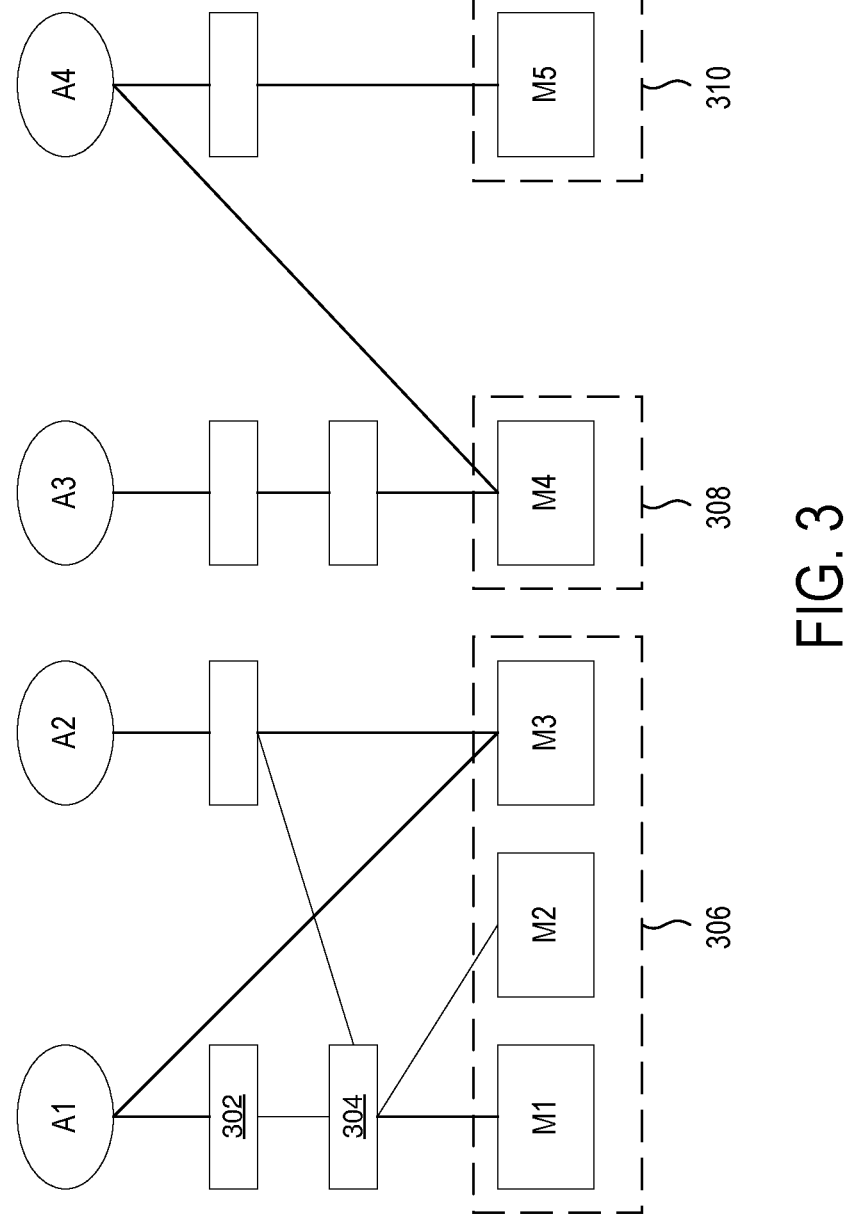
FIG. 3 shows an example in which macros are grouped according to coupling of the macros to anchors.

FIG. 3 shows an example in which macros are grouped according to coupling of the macros to anchors. FIG. 3 shows a graphical representation of a netlist generated from a portion of an exemplary circuit design. The graph shows macros M1, M2, M3, M4, and M5 and anchors A1, A2, A3, and A4. Logic elements (elements other than macros and anchors such as pipeline registers, combinational logic, etc.) of the circuit design are represented by blocks. For example, blocks 302 and 304 are elements coupled between macro M1 and anchor A1. Lines in the graph represent communicative coupling (e.g., data, address, or control signals) of elements of the circuit design.

According to the disclosed approaches, groups of macros are formed based on shared sets of anchors to which the macros are coupled. Macros that are coupled to the same set of one or more anchors are assigned to a group. Macros are assigned to the same group if the sets of anchors to which the macros are coupled are identical. That is, a first macro and a second macro are assigned to the same group the set of anchors to which the first macro is coupled has the same elements, no more and no less, as the set of anchors to which the second macro is coupled.

In the example, macros M1, M2, and M3 are all coupled to anchors A1 and A2, and none of the macros are coupled to any other anchor. Macros M1, M2, and M3 are assigned to the same group, as illustrated by dashed block 306. Macros M4 and M5 are both coupled to anchor A4. However, macro M4 is coupled to anchor A3 and macro M5 is not. Therefore, macros M4 and M5 are assigned to different groups 308 and 310.

Figure 4:
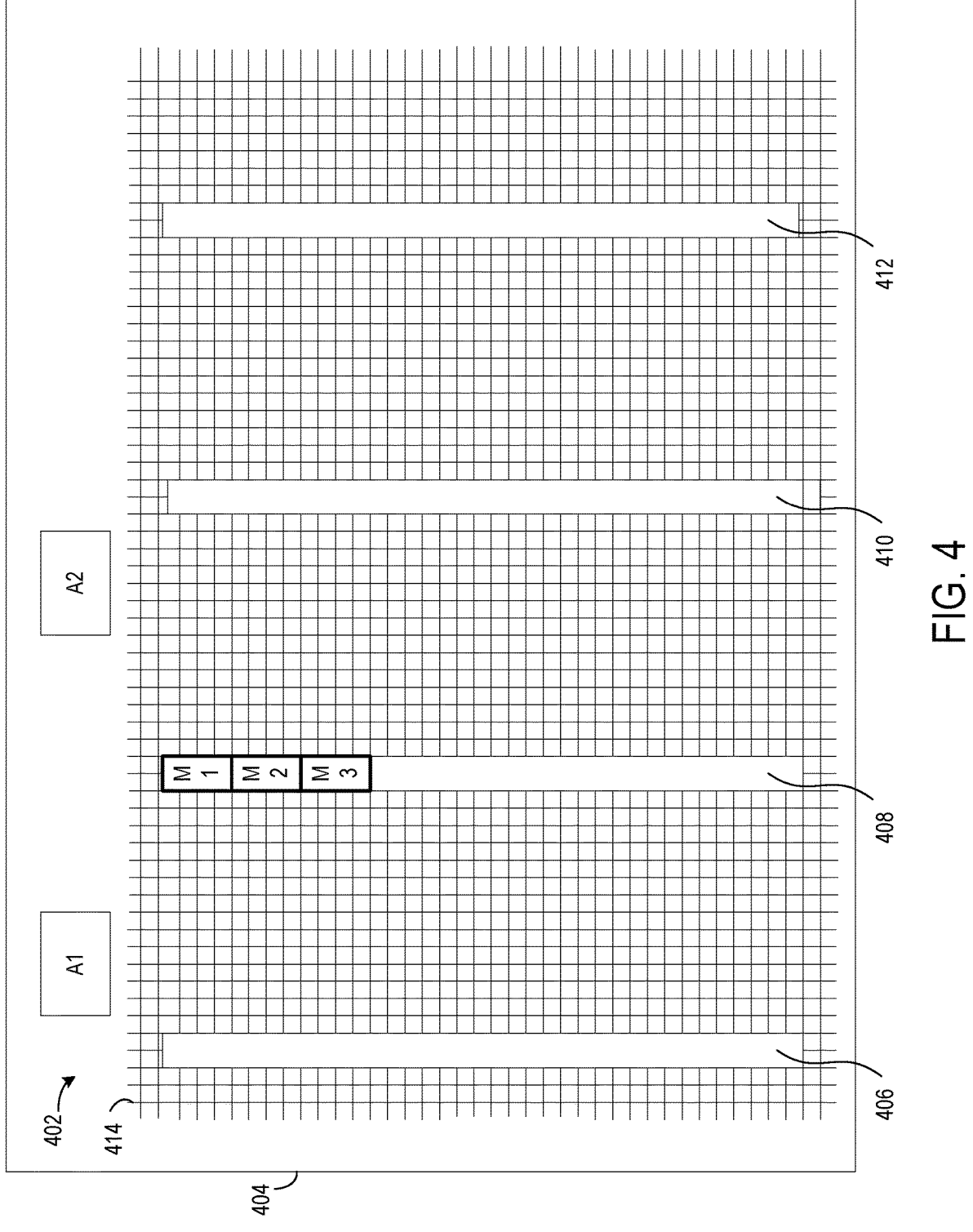
FIG. 4 shows an example of a group of macros placed in a column based on proximity of the group to a shared set of anchors.

FIG. 4 shows an example of a group of macros placed in a column based on proximity of the group to a shared set of anchors. The example of FIG. 4 shows a portion 402 of a programmable IC 404. The complete programmable IC would have circuitry in addition to the illustrated elements, such as the sub-circuits shown and described in FIGS. 1 and 2.

Blocks 406, 408, 410, and 412 are examples of columns of instances of a type of sub-circuit on which the macros M1, M2, and M3 could alternatively be placed. The instances of a sub-circuit in a column provide a location(s) at which a group(s) of macros can be placed. A macro can require multiple instances of a type of sub-circuit, depending on the parameters of the macro. A site corresponds to the location of an instance of the type of sub-circuit in a column. A location includes one or more sites of instances of a sub-circuit in a column. Thus, the placement of a group of macros can be at a location that covers multiple sites. In some implementations a location can include instances of different types of sub-circuits interspersed in a column.

The grid 414 represents programmable logic and routing resources of the programmable IC, for example. Anchors A1 and A2 are disposed at fixed locations on the programmable IC. Macros M1, M2, and M3 are the macros in a group and are together assigned to a location in column 408. Note that the group of macros M1, M2, and M3 of FIG. 4 continues the example of FIG. 3 (without the placement of the groups for macros M4 and M5.). The location at which the group of macros is placed refers to the area of the programmable IC occupied by the instances of the sub-circuit in the column 408.

According to the disclosed approaches, the exemplary location for the group of macros M1, M2, and M3 is selected over other possible alternative locations for the group, such as another location in column 408 or locations in columns 406, 410, and 412. The selection of the location of the group can be made based on a number of factors. One factor is the distance between a location and the set of anchors shared by the group of macros. For a group based on a set of multiple anchors, the location of the set of anchors can be the midpoint of the individual locations of the anchors. For example, the midpoint between anchors A1 and A2 on a horizontal axis is a point above column 408. Generally, for multiple anchors, the mean of positions along an axis can be used as the location of the set of anchors.

Given that the instances of a sub-circuit are disposed in a column on the target programmable IC, placing a group consisting of a large number of macros in one column may result in long wirelengths between anchors at one end of a column and macros of the group placed at the other end of the column. In order to reduce wirelengths, in response to the number of macros that are coupled to the same set of anchors exceeding a threshold, two or more groups of macros can be formed. The groups are coupled to the same set of anchors but are individually placed. Based on the minimum distance, and other factors, such as the number of anchors coupled to the group, the number of pipeline registers, and number of macros in the group, the groups can be placed in multiple different columns, such as one group in column 408 and another group in column 410.

FIG. 5 shows a flowchart of an exemplary process that groups and places macros according to coupled anchors. At block 502, the design tool, following recognized processes of a design flow, synthesizes the circuit design into a netlist and maps elements of the netlist to types of sub-circuits of the target programmable IC.

The design tool, at block 504, forms groups of macros of the circuit design based on couplings of the macros to anchors on the programmable IC. The design tool can identify macros coupled to an anchor by tracing the netlist from each of the anchors in the netlist to each macro coupled to that anchor. The design tool can identify the set of anchors that are coupled to a macro by tracing the netlist back from the macro.

Macros having identical sets of coupled anchors are assigned to a group. According to an exemplary approach, if the number of macros that can be assigned to a group exceeds a threshold, multiple groups of macros can be formed such that each of the groups has a number of macros that is less than or equal to the threshold. For each group, the design tool can save a list of the macros in the group and the anchors coupled to the macros of the group.

At block 506, the design tool finds the nearest locations for the groups of macros. As explained above, the design tool can determine a desirable location for a group of macros based on distances between multiple alternative locations on the programmable IC and the location of the shared set of anchors of the group.

At block 508, for multiple groups of macros found to have the same optimal location, the design tool uses a cost function to determine the priority for assigning the location to one of the groups. The cost function is applied to each of the competing groups and can include factors such as the number of pipeline registers and the number of anchors. The location can be assigned to the group of macros having the greatest priority as indicated by the cost function.

The number of pipeline registers indicates the total number of pipeline register in a signal paths between all of the macros in the group and all of the anchors of the shared set of anchors. The number of anchors is the number anchors that are in the shared set of anchors of a group of macros. The cost function can yield a higher priority for a group of macros having a greater number of anchors in the than for a group of macros having a lesser number anchors, assuming the number of pipeline registers is equal. The cost function can yield a higher priority for a group of macros having a lesser number of pipeline registers than for a group of macros having a greater number anchors, assuming the number of anchors is equal. The cost function can apply weights to the factors according to relative levels of importance.

At block 510, the design tool specifies constraints that indicate the locations at which the groups of macros are to be placed. The constraint specified for a group of macros communicates to the placer logic of the design tool, a region of the target device in which placement of the group of macro is to be restricted. The placer logic places the groups of macros having such constraints before placing the other logic of the circuit design.

At block 512, the design tool places and routes the circuit design and generates implementation data. The implementation data can be used to make an operable programmable IC device at block 514.

Figure 6:
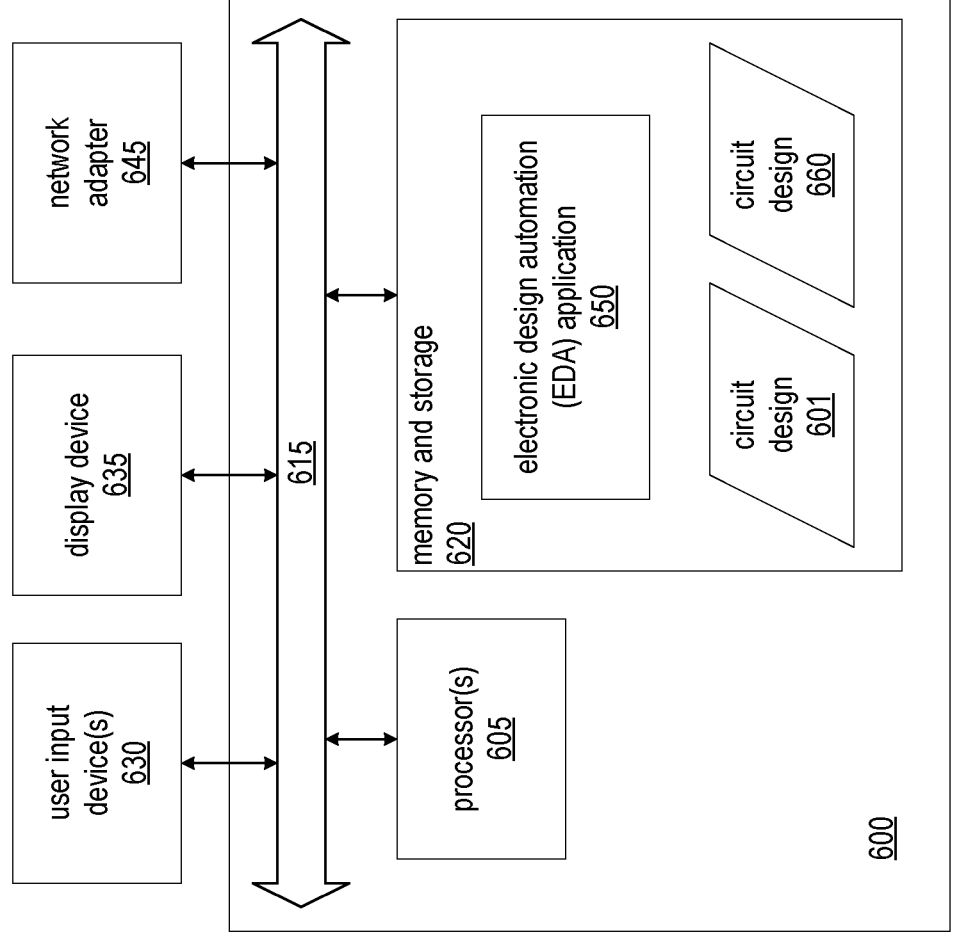
FIG. 6 is a block diagram illustrating an exemplary data processing system.

FIG. 6 is a block diagram illustrating an exemplary data processing system (system) 600. System 600 is an example of an EDA system. As pictured, system 600 includes at least one processor 605 (i.e., processor circuit), e.g., a central processing unit (CPU) coupled to memory and storage arrangement 620 through a system bus 615 or other suitable circuitry. System 600 stores program code and circuit design 601 within memory and storage arrangement 620. Processor 605 executes the program code accessed from the memory and storage arrangement 620 via system bus 615. In one aspect, system 600 is implemented as a computer or other data processing system that is suitable for storing and/or executing program code. It should be appreciated, however, that system 600 can be implemented in the form of any system including a processor and memory that is capable of performing the functions described within this disclosure.

Memory and storage arrangement 620 includes one or more physical memory devices such as, for example, a local memory (not shown) and a persistent storage device (not shown). Local memory refers to random access memory or other non-persistent memory device(s) generally used during actual execution of the program code. Persistent storage can be implemented as a hard disk drive (HDD), a solid state drive (SSD), or other persistent data storage device. System 600 may also include one or more cache memories (not shown) that provide temporary storage of at least some program code and data in order to reduce the number of times program code and data must be retrieved from local memory and persistent storage during execution.

Input/output (I/O) devices such as user input device(s) 630 and a display device 635 may be optionally coupled to system 600. The I/O devices may be coupled to system 600 either directly or through intervening I/O controllers. A network adapter 645 also can be coupled to system 600 in order to couple system 600 to other systems, computer systems, remote printers, and/or remote storage devices through intervening private or public networks. Modems, cable modems, Ethernet cards, and wireless transceivers are examples of different types of network adapter 645 that can be used with system 600.

Memory and storage arrangement 620 may store an EDA application 650. EDA application 650, being implemented in the form of executable program code, is executed by processor(s) 605. As such, EDA application 650 is considered part of system 600. System 600, while executing EDA application 650 as a design tool, receives and operates on circuit design 601. In one aspect, system 600 performs a design flow on circuit design 601, and the design flow includes synthesis, mapping, placement, routing, along with the grouping of macros and selection of locations of the groups as described herein. System 600 generates an optimized, or modified, version of circuit design 601 as circuit design 660.

EDA application 650, circuit design 601, circuit design 660, and any data items used, generated, and/or operated upon by EDA application 650 are functional data structures that impart functionality when employed as part of system 600 or when such elements, including derivations and/or modifications thereof, are loaded into an IC such as a programmable IC causing implementation and/or configuration of a circuit design within the programmable IC.

Some implementations are directed to a computer program product (e.g., nonvolatile memory device), which includes a machine or computer-readable medium having stored thereon instructions which may be executed by a computer (or other electronic device) to perform these operations/activities Though aspects and features may in some cases be described in individual figures, it will be appreciated that features from one figure can be combined with features of another figure even though the combination is not explicitly shown or explicitly described as a combination.

The methods and systems are thought to be applicable to a variety of systems for placing macros of a circuit design. Other aspects and features will be apparent to those skilled in the art from consideration of the specification. It is intended that the specification and drawings be considered as examples only, with a true scope of the invention being indicated by the following claims.

What is claimed is:

1. A method comprising:
mapping macros of a circuit design by a design tool to types of sub-circuits of an integrated circuit (IC), wherein the IC includes a plurality of anchors and a plurality of instances of each type of the types of sub-circuits;
forming, by the design tool, functionally-defined groups of macros based on logical couplings of the macros to the plurality of anchors specified in the circuit design, wherein each group includes one or more macros, and the one or more macros in each group are all coupled to a same set of one or more anchors of the plurality of anchors;
selecting a location by the design tool from a plurality of alternative locations for each group of macros based on a distance of the location from the same set of one or more anchors of the plurality of anchors, wherein each location includes one or more instances of one or more types of the types of sub-circuits of the IC;
placing and routing the circuit design by the design tool after the selecting the location for each group; and
generating implementation data by the design tool after the placing and routing for making an IC that implements the circuit design.

2. The method of claim 1, wherein the one or more instances of one or more types of sub-circuits of each location are arranged in a column of a plurality of columns on the IC.

3. The method of claim 2, wherein the forming the groups includes, for a plurality of macros coupled to a same one of the plurality of anchors and the plurality of macros being greater than a threshold number of macros, forming two or more groups of macros from the plurality of macros, wherein each group of the two or more groups has a number of macros that is less than or equal to the threshold number of macros.

4. The method of claim 3, wherein the selecting the location for each group of macros includes selecting two or more locations for the two or more groups in two or more columns of the plurality of columns.

5. The method of claim 1, wherein the selecting the location for each group of macros includes, for a group of macros having the one or more macros all coupled to a same set of two or more anchors of the plurality of anchors, selecting the location based on a distance of the location to a midpoint of locations of the two or more anchors of the plurality of anchors.

6. The method of claim 1, wherein the distance of the location from the same set of one or more anchors of the plurality of anchors is based on a number of pipeline registers between the same set of one or more anchors of the plurality of anchors and the one or more macros of the group.

7. The method of claim 1, wherein the selecting the location for each group of macros includes selecting the location based a total number of anchors the macros of the group are all coupled to.

8. The method of claim 1, wherein the plurality of anchors includes fixed logic subcircuits disposed at fixed locations on the IC.

9. The method of claim 1, wherein the macros include one or more of RAM circuits or arithmetic circuits.

10. The method of claim 1, further comprising configuring a programmable IC with the implementation data to implement the circuit design on the programmable IC.

11. A system comprising:
one or more computer processors configured to execute program code; and
a memory arrangement coupled to the one or more computer processors, wherein the memory arrangement is configured with instructions of a design tool that when executed by the one or more computer processors cause the one or more computer processors to perform operations including:
mapping macros of a circuit design to types of sub-circuits of an integrated circuit (IC), wherein the IC includes a plurality of anchors and a plurality of instances of each type of the types of sub-circuits;
forming, by the design tool, functionally-defined groups of macros based on logical couplings of the macros to the plurality of anchors specified in the circuit design, wherein each group includes one or more macros, and the one or more macros in each group are all coupled to a same set of one or more anchors of the plurality of anchors;
selecting a location from a plurality of alternative locations for each group of macros based on a distance of the location from the same set of one or more anchors of the plurality of anchors, wherein each location includes one or more instances of one or more types of the types of sub-circuits of the IC;
placing and routing the circuit design after selecting the location for each group; and
generating implementation data after the placing and routing for making an IC that implements the circuit design.

12. The system of claim 11, wherein the one or more instances of one or more types of sub-circuits of each location are arranged in a column of a plurality of columns on the IC.

13. The system of claim 12, wherein the instructions for forming the groups include, for a plurality of macros coupled to a same one of the plurality of anchors and the plurality of macros being greater than a threshold number of macros, instructions for forming two or more groups of macros from the plurality of macros, wherein each group of the two or more groups has a number of macros that is less than or equal to the threshold number of macros.

14. The system of claim 13, wherein the instructions for selecting the location for each group of macros include instructions for selecting two or more locations for the two or more groups in two or more columns of the plurality of columns.

15. The system of claim 11, wherein the instructions for selecting the location for each group of macros include, for a group of macros having the one or more macros all coupled to a same set of two or more anchors of the plurality of anchors, instructions for selecting the location based on a distance of the location to a midpoint of locations of the two or more anchors of the plurality of anchors.

16. The system of claim 11, wherein the distance of the location from the same set of one or more anchors of the plurality of anchors is also based on a number of pipeline registers between the same set of one or more anchors of the plurality of anchors and the one or more macros of the group.

17. The system of claim 11, wherein the instructions for selecting the location for each group of macros include, instructions for selecting the location based a total number of anchors the macros of the group are all coupled to.

18. The system of claim 11, wherein the plurality of anchors includes fixed logic sub-circuits disposed at fixed locations on the IC.

19. The system of claim 11, wherein the macros include one or more of RAM circuits or arithmetic circuits.

20. The system of claim 11, the memory arrangement is further configured with instructions that when executed by the one or more computer processors cause the one or more computer processors to configure a programmable IC with the implementation data to implement the circuit design on the programmable IC.

* * * * *